United States Patent
Liu et al.

(10) Patent No.: US 10,627,685 B2
(45) Date of Patent: Apr. 21, 2020

(54) ARRAY SUBSTRATE AND METHOD FOR FABRICATING THE SAME, DISPLAY PANEL AND DISPLAY DEVICE

(71) Applicants: BOE TECHNOLOGY GROUP CO., LTD., Beijing (HK); BEIJING BOE OPTOELECTRONICS TECHNOLOGY CO., LTD., Beijing (CN)

(72) Inventors: Chong Liu, Beijing (CN); Haisheng Zhao, Beijing (CN); Xiaoguang Pei, Beijing (CN); Zhilian Xiao, Beijing (CN); Zhilong Peng, Beijing (CN); Hongxi Xiao, Beijing (CN); Wei Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/736,279

(22) PCT Filed: Apr. 25, 2017

(86) PCT No.: PCT/CN2017/081818
§ 371 (c)(1),
(2) Date: Dec. 13, 2017

(87) PCT Pub. No.: WO2017/202167
PCT Pub. Date: Nov. 30, 2017

(65) Prior Publication Data
US 2018/0188573 A1    Jul. 5, 2018

(30) Foreign Application Priority Data

May 25, 2016    (CN) .......................... 2016 1 0353751

(51) Int. Cl.
| | | |
|---|---|---|
| H01L 27/12 | (2006.01) | |
| G02F 1/1362 | (2006.01) | |
| G09G 3/00 | (2006.01) | |
| G02F 1/1345 | (2006.01) | |
| H01L 21/77 | (2017.01) | |

(52) U.S. Cl.
CPC ........ *G02F 1/1362* (2013.01); *G02F 1/13452* (2013.01); *G09G 3/00* (2013.01);
(Continued)

(58) Field of Classification Search
CPC ....... H01L 2924/00014; H01L 2924/00; H01L 2224/45144; H01L 2224/48091;
(Continued)

(56) References Cited

U.S. PATENT DOCUMENTS

| | | | | |
|---|---|---|---|---|
| 2013/0270582 A1* | 10/2013 | Shin | ........................ | H01L 33/48 257/88 |
| 2014/0138123 A1* | 5/2014 | Chen | ........................ | H05K 1/11 174/251 |
| 2017/0160841 A1* | 6/2017 | Lou | ........................ | G06F 3/0412 |

FOREIGN PATENT DOCUMENTS

| | | |
|---|---|---|
| CN | 101561602 A | 10/2009 |
| CN | 202585418 U | 12/2012 |

(Continued)

OTHER PUBLICATIONS

Written Opinion received for PCT Patent Application No. PCT/CN2017/081818, dated Jul. 28, 2017, 6 pages (2 pages of English Translation and 4 pages of Original Document).

(Continued)

*Primary Examiner* — Tony Tran
(74) *Attorney, Agent, or Firm* — Womble Bond Dickinson (US) LLP

(57) ABSTRACT

An array substrate, a method for fabricating the same, a display panel and a display device are disclosed. The array substrate comprises leading wires, the plurality of leading (Continued)

wires form a plurality of grooves in a fanout area of the array substrate, the plurality of grooves are filled with a filler, and the filler filled in the grooves has an upper surface which is flush with leading wires surrounding the grooves. The filler is made from an insulating and transparent material.

3 Claims, 4 Drawing Sheets

(52) U.S. Cl.
CPC .............. *H01L 21/77* (2013.01); *H01L 27/12* (2013.01); *H01L 27/124* (2013.01)

(58) Field of Classification Search
CPC ......... H01L 2224/48227; H01L 27/124; H01L 27/1225; H01L 27/1248; H01L 27/1288; H01L 2924/0002
See application file for complete search history.

(56) References Cited

FOREIGN PATENT DOCUMENTS

| CN | 103293800 A | 9/2013 |
|---|---|---|
| CN | 103376606 A | 10/2013 |
| CN | 103839907 A | 6/2014 |
| CN | 105573549 A | 5/2016 |
| CN | 105932025 A | 9/2016 |

OTHER PUBLICATIONS

Office Action received for Chinese Patent Application No. 201610353751.0, dated May 3, 2018, 12 pages (6 pages of English Translation and 6 pages of Office Action).

International Search Report received for PCT Patent Application No. PCT/CN2017/081818, dated Jul. 28, 2017, 6 pages (2 pages of English Translation and 4 pages of Original Document).

* cited by examiner

ARRAY SUBSTRATE AND METHOD FOR FABRICATING THE SAME, DISPLAY PANEL AND DISPLAY DEVICE

RELATED APPLICATIONS

The present application is the U.S. national phase entry of PCT/CN2017/081818, with an international filing date of Apr. 25, 2017, which claims the benefit of Chinese Patent Application No. 201610353751.0, filed on May 25, 2016, the entire disclosures of which are incorporated herein by reference.

TECHNICAL FIELD

The present disclosure relates to the field of display technology, and particularly to an array substrate, a method for fabricating the same, a display panel, and a display device.

BACKGROUND

A thin film transistor liquid crystal display device (TFT-LCD) is irradiated with light from a back side. In particular, light from a light source travels in an upward direction. A specific light pipe is arranged at a back side of liquid crystal, light from the light source irradiates the light pipe and then transmitted upward through a lower polarizer sheet. Since the upper and lower electrodes are a transparent electrode and a common electrode. When the transparent electrode is conducted, the appearance of liquid crystal molecules will change to block and transmit light for realizing the display function. The responsive time is improved up to about 80 ms. This kind of display device has a high contrast and rich color, and the screen has a fast refresh rate. Thus, a TFT-LCD display panel has become a mainstream product in the display field.

In a process for fabricating a TFT-LCD display panel, since the resolution of the display panel is increasingly higher, the number of signal lines which are connected with each pixel unit increases accordingly. This causes the signal lines cannot be arranged in a single layer of the fanout area. Thus, the signal lines have to be arranged alternately in different layers. As shown in FIG. 1, a display panel comprises a plurality of pixel units 10 which are arranged in an array, and each column of pixel units 10 is connected with a same one of the data lines 11. When the number of pixel units comprised in the display panel increases, the number of data lines increases accordingly. Thus, in the fanout area A of the display panel, the data lines are arranged more densely at corners, so that grooves 12 occur in the fanout area. Thus, during the subsequent layer processes, a coating machine generally operates in a spinning mode, so that difference in a photoresist layer may appear in the corner direction. This influences difference in size of a transparent conductive layer (ITO FICD) and difference in size of a source/drain layer (SD FICD). As a result, once the array substrate fabricated by this process is assembled with a color film substrate to form a display panel, the display panel suffers from skew defect (Mura).

With the display panel develops toward full high definition (FHD), data lines are arranged in the fanout area in a denser manner. In case data lines are arranged alternately in different layers, the grooves become serious, and accordingly the skew defect becomes serious.

SUMMARY

An embodiment of the present disclosure provides an array substrate, comprising a plurality of leading wires, wherein the plurality of leading wires form a plurality of grooves in a fanout area of the array substrate, the plurality of grooves are filled with a filler, and the filler filled in the grooves has an upper surface which is flush with leading wires surrounding the grooves; and wherein the filler is made from an insulating and transparent material.

In a possible implementation of the above array substrate, the array substrate further comprises a plurality of TFTs which are electrically connected with each of the leading wires.

In a possible implementation of the above array substrate, the leading wires comprise data lines which are connected with sources of the TFTs.

In a possible implementation of the above array substrate, the leading wires comprise gate lines which are connected with gates of the TFTs.

In a possible implementation of the above array substrate, the filler comprises a same material as a gate insulating layer of the TFTs.

In a possible implementation of the above array substrate, the filler comprises silicon nitride, silicon oxide or a combination thereof.

In a possible implementation of the above array substrate, the filler comprises a same material as an active layer of the TFTs.

In a possible implementation of the above array substrate, the filler is indium gallium zinc oxide, indium tin zinc oxide or amorphous silicon.

Accordingly, an embodiment of the present disclosure further provides a display panel, comprising the array substrate in any one of the above embodiments.

Accordingly, an embodiment of the present disclosure further provides a display device, comprising the display panel in any one of the above embodiments.

Accordingly, an embodiment of the present disclosure further provides a method for fabricating the array substrate in any one of the above embodiments, the method comprises:

forming the leading wires on the substrate by a patterning process; and filling a filler in a plurality of grooves which are formed by the plurality of leading wires in a fanout area of the array substrate, wherein the filler filled in the grooves has an upper surface which is flush with leading wires surrounding the grooves, wherein the filler is made from an insulating and transparent material.

In a possible implementation of the above method, forming the leading wires on the substrate by the patterning process comprises:

at a same time forming a pattern of gates of TFTs, forming a pattern of the leading wires; and forming a pattern of a first gate insulating layer above the gate and the leading wires, wherein the leading wires form grooves in the fanout area of the array substrate.

In a possible implementation of the above method, filling the filler in the plurality of grooves which are formed by the plurality of leading wires in the fanout area of the array substrate comprises:

forming a second gate insulating layer above the first gate insulating layer in the fanout area; and etching the second gate insulating layer above the leading wires in the fanout area, so that the first gate insulating layer above the leading wires is exposed, and an upper surface of the first gate insulating layer above the leading wires is flush with an upper surface of the second gate insulating layer.

In a possible implementation of the above method, filling the filler in the plurality of grooves which are formed by the plurality of leading wires in the fanout area of the array substrate further comprises:

forming a pattern of an active layer above the first gate insulating layer; and etching the active layer in the fanout area, so that the first gate insulating layer above the leading wires is exposed, and an upper surface of the first gate insulating layer above the leading wires is flush with an upper surface of the active layer.

The display panel, the display device, and the method for fabricating an array substrate have same or similar embodiments with the array substrate as described above, and accordingly have same or similar advantages and beneficial effects.

DETAILED DESCRIPTION OF EMBODIMENTS

To make the objects, the technical solutions and the advantages of embodiments of the present disclosure more apparent, the technical solutions of the embodiments of the present disclosure will be described in detail hereinafter in conjunction with the drawings of the embodiments of the present disclosure.

Embodiments of the present disclosure provide an array substrate, a method for fabricating the same, a display panel, and a display device, which at least alleviate the skew defect due to grooves among leading wires in the fanout area of the array substrate.

Implementations of the array substrate, the method for fabricating the same, the display panel, and the display device will be described in detail hereinafter with reference to the accompanying drawings.

Figure 1:
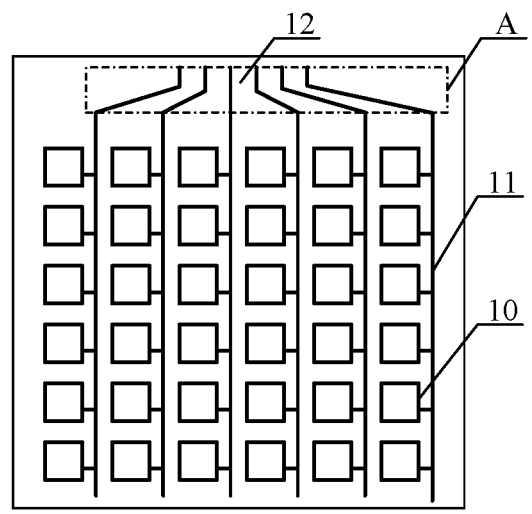
FIG. 1 is a structural view for illustrating an array substrate.
Figure 2:
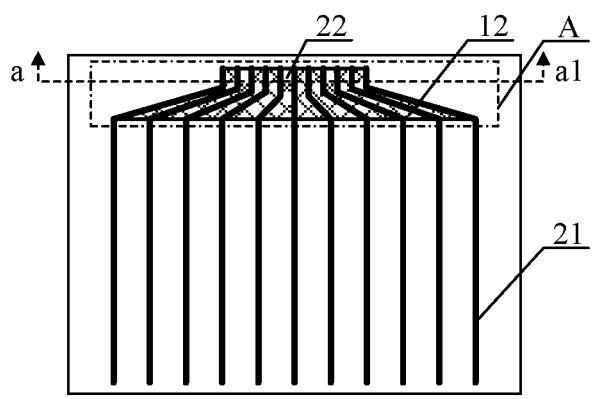
FIG. 2 is a front view for illustrating an array substrate in an embodiment of the present disclosure.

An embodiment of the present disclosure provides an array substrate, as shown by a front view of the array substrate in FIG. 2. The array substrate comprises a plurality of leading wires 21. The plurality of leading wires 21 form a plurality of grooves 12 in a fanout area A of the array substrate. The grooves 12 are filled with a filler 22, so that the filler 22 filled in the grooves 12 has an upper surface which is flush with the leading wires 21 surrounding the grooves. The filler 22 is made from an insulating and transparent material.

Figure 3:
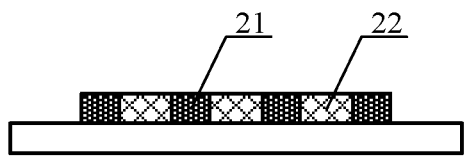
FIG. 3 is a cross-sectional view along a-a1 direction in FIG. 2.

The structure of the filler in the region of the grooves is further explained with reference to FIG. 3. The filler 22 filled in the grooves 12 has an upper surface which is flush with the leading wires 21 surrounding the grooves. FIG. 3 is a cross-sectional view along a-a1 direction in FIG. 2. For simplicity, FIG. 3 only show some of the leading wires 21, the grooves 12 and the filler 22.

It is noted that the array substrate comprises a display region and a frame region, and the fanout area is located in the frame region of the array substrate. FIG. 2 only shows a case in which the fanout area is located an upper frame region of the display region. The array substrate comprises a lot of TFTs, and four frame regions at the top, bottom, left, and right side of the display region contain leading wires. Thus, the fanout area is located in the top, bottom, left, and right four frame regions. When the leading wires are concentrated and arranged in the fanout area, grooves are formed. Thus, it is within the scope of the present disclosure that grooves in the fanout area of the array substrate which results from the leading wires are filled with insulating and transparent material.

In an embodiment of the present disclosure, the leading wires comprise various signal lines in the fanout area.

In embodiments of the present disclosure, the array substrate comprises a plurality of leading wires, the plurality of leading wires form a plurality of grooves in a fanout area of the array substrate. The plurality of grooves are filled with a filler, so that the filler filled in the grooves has an upper surface which is flush with leading wires surrounding the grooves. The filler is made from an insulating and transparent material. Thus, in embodiments of the present disclosure, since the grooves are filled with the insulating and transparent filler, the upper surface of the filler filled in the grooves is flush with leading wires surrounding the grooves. This alleviates an uneven morphology in the fanout area which results from the leading wires, and avoids the skew defect in the array substrate. The filler has an insulating property, and prevents leading wires from electrical connection with other conductors which otherwise would lead to cross-talk in signal. When the array substrate is subsequently bonded with the color film substrate, a UV glue is applied which is cured by exposure to light. Thus, the transparent filler facilitates curing the UV glue by exposure to light.

For example, the array substrate further comprises a plurality of TFTs which are electrically connected with each of the leading wires.

In particular, the display region of the array substrate comprises a plurality of pixel units which are arranged in an array. The leading wires are required to connect with each of the pixel units, and comprise gate lines which are connected with gates of TFTs in the pixel units, and data lines which are connected with sources of TFTs in the pixel units. Thus, in embodiments of the present disclosure, the leading wires comprise gate lines and data lines which are connected with TFTs.

For example, in an embodiment of the present disclosure, the leading wires the array substrate comprise data lines.

In particular, in the array substrate of a higher resolution, there are a lot of pixel units, and the number of data lines also increases. Data lines are required to arrange in a concentrated manner in the fanout area. In order to reduce the area of wirings, the wirings are arranged in different layers. For example, the data lines are arranged in two layers, and are arranged in a same layer as the gate or the source of TFT in the pixel units. Thus, when the data lines are arranged in a same layer as the gate, a plurality of grooves are formed at corners of the fanout area. In the gate insulating layer which is formed above the gate, the grooves still remain. In order to reduce the skew defect due to grooves, after the data lines are formed in a same layer as the gate, the grooves are filled with a filler, or after the gate insulating layer is formed, the grooves are filled with a filler; and when data lines are formed in a same layer as the source, the grooves are filled with a filler.

It is noted that in case the leading wires are data lines, in case the data lines are arranged in a same layer as the source of TFT, grooves formed among the data lines are filled by the filler. In case the data lines are arranged in a different layer from the gate and source of TFT, grooves which are formed during arranging the data lines and the gate in a same layer are filled by the filler, and grooves which are formed during arranging the data lines and the source in a same layer are filled by the filler; or, grooves which are formed during arranging the data lines and the gate in a same layer are filled by the filler; or, grooves which are formed during arranging the data lines and the source in a same layer are filled by the filler.

For example, the filler comprises a same material as the gate insulating layer of TFT.

In particular, in an embodiment of the present disclosure, the filler has insulating and transparent property, in order to prevent cross-talk in signal from other conductors. When the array substrate is subsequently bonded with the color film substrate, a UV glue is applied which is cured by exposure to light. Thus, the transparent filler facilitates curing the UV glue by exposure to light. In a specific embodiment, the filler comprises a same material as the gate insulating layer of TFT. For example, the filler is silicon nitride, silicon oxide or a combination thereof, but embodiments of the present disclosure are not limited to this.

For example, the filler comprises a same material as the active layer of TFT.

For example, in embodiments of the present disclosure, the filler comprises a semiconductor oxide such as indium gallium zinc oxide (IGZO), indium tin zinc oxide (ITZO), or amorphous silicon.

Figure 4:
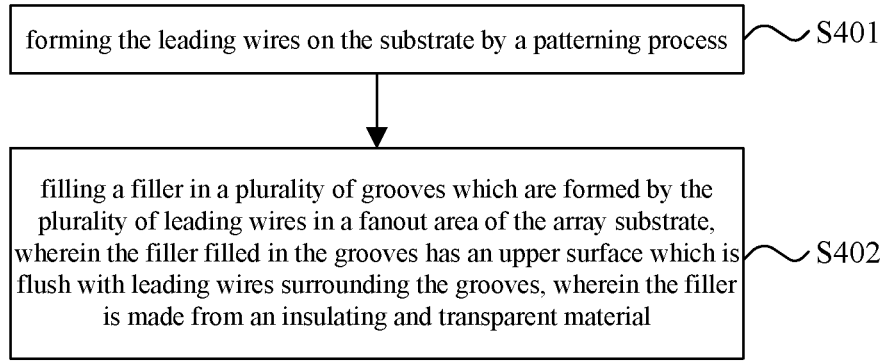
FIG. 4 is a flow chart for illustrating a method for fabricating an array substrate in an embodiment of the present disclosure.

On basis of the same inventive concept, an embodiment of the present disclosure further provides a method for fabricating an array substrate. As shown in FIG. 4, the method comprises:

S401, forming the leading wires on the substrate by a patterning process; and

S402, filling a filler in a plurality of grooves which are formed by the plurality of leading wires in a fanout area of the array substrate, wherein the filler filled in the grooves has an upper surface which is flush with leading wires surrounding the grooves. The filler is made from an insulating and transparent material.

In the above method for fabricating an array substrate, leading wires are formed on substrate by a patterning process. The plurality of grooves formed in the fanout area of the array substrate are filled with a filler, so that the filler filled in the grooves has an upper surface which is flush with leading wires surrounding the grooves. The filler is made from an insulating and transparent material. The filler has an insulating property, and prevents leading wires from electrical connection with other conductors which otherwise would lead to cross-talk in signal. When the array substrate is subsequently bonded with the color film substrate, a UV glue is applied which is cured by exposure to light. Thus, the transparent filler facilitates curing the UV glue by exposure to light. Thus, in the method according to an embodiment of the present disclosure, the grooves are filled with the insulating and transparent filler, the upper surface of the filler filled in the grooves is flush with leading wires surrounding the grooves. This alleviates an uneven morphology in the fanout area which results from the leading wires, and avoids the skew defect in the array substrate.

It is noted that in the above method, the patterning process comprises any form of patterning approach. In an example, the patterning process comprises an approach comprising photoresist exposure, photoresist development, and etching. In this example, the patterning process comprises steps of: coating photoresist, exposure with a mask plate, development, etching a layer from which a pattern will be formed, so as to form the desired pattern. The patterning process may appear for several times in this context, and does not necessarily comprise exactly the same process steps.

It is noted that embodiments of the present disclosure are directed to fill the grooves formed in the fanout area where leading wires are densely arranged in an array substrate with a high resolution. To avoid that there is no enough space, leading wires are generally arranged alternately in different layers. For example, the data lines are arranged in a same layer as the gate and a same layer as the source. Thus, the groove region is filled at a same time as forming leading wires which are arranged in a same layer as the gate. As for an array substrate with a low resolution, the data lines are arranged in a single layer. Generally, the data lines are arranged in a same layer as the source of TFT, and grooves are present among data lines of a single layer structure in the fanout area. In this case, leveling up the grooves with a filler according to embodiments of the present disclosure can also be adopted.

In practice, in the above method, step S401 is performed in the following manner.

Figure 5A:
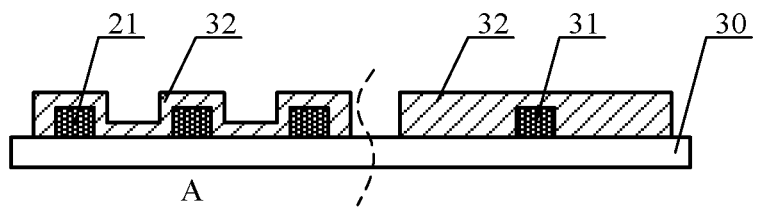
FIG. 5a, FIG. 5b, and FIG. 5c are structural views for illustrating an array substrate at each step of a method for fabricating an array substrate in an embodiment of the present disclosure.

When a pattern of a gate 31 of TFT is formed on a substrate 30 of the array substrate, a pattern of the leading wires 21 is formed at the same time. A pattern of a first gate insulating layer 32 is formed above the gate 31 and the leading wires 21. Here, the leading wires 21 form grooves in the fanout area A of the array substrate, as shown in FIG. 5a.

In particular, the leading wires are arranged in a same layer and formed at a same time as the gate of TFT, thus simplifying the process. The leading wires are data lines. In order to electrically connect the leading wires which are arranged in a same layer as the gate with the source of TFT, a via is formed in the gate insulating layer after the gate is formed, so as to connect the leading wires with the source.

In particular, leveling up of grooves may be realized by performing the patterning process for one time or two times, and the present disclosure is not limited in this regard.

In practice, in the above method, step S402 is performed in the following manner.

Figure 5B:
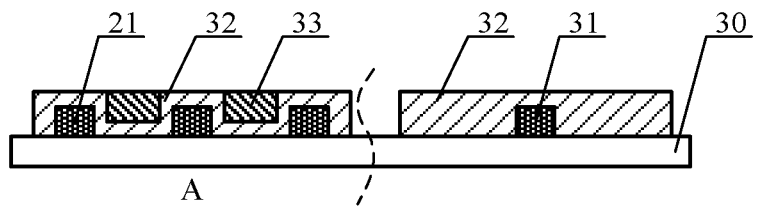

A second gate insulating layer 33 is formed above the first gate insulating layer 32 in the fanout area A. The second gate insulating layer 33 above the leading wires in the fanout area is etched, so that the first gate insulating layer 32 above the leading wires is exposed, and the first gate insulating layer 32 above the leading wires has an upper surface which is flush with upper surface of the second gate insulating layer 33, as shown in FIG. 5b.

The first gate insulating layer and the second gate insulating layer comprise a same or different material. For example, the material is a material with transparent and insulating property, such as silicon nitride or silicon oxide. After forming the first gate insulating layer of TFT, and prior to forming the active layer, a second gate insulating layer is formed above the first gate insulating layer in the fanout area, and then the second gate insulating layer is etched in a patterning process.

It is also possible that after the leading wires which are arranged in a same layer as the gate are formed, the first gate insulating layer is formed above the leading wires, and the first gate insulating layer is etched in a patterning process, so that the first gate insulating layer in the groove region has an upper surface which is flush with the upper surface of the leading wires. Then, the second gate insulating layer is formed above the gate of TFT, and at the same time, the second gate insulating layer is formed above the leading wires and the first gate insulating layer.

In practice, in the above method, step S402 can also be performed in the following manner.

Figure 5C:
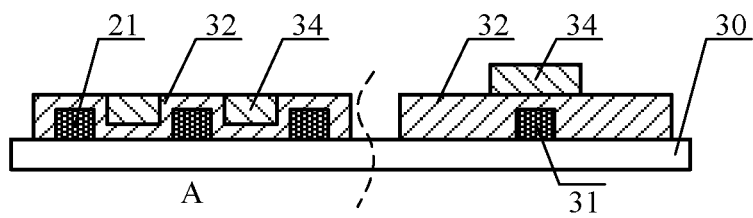

A pattern of an active layer 34 is formed above the first gate insulating layer 32. The active layer 34 in the fanout area A is etched, so that the first gate insulating layer 32 above the leading wires 21 is exposed, and the first gate insulating layer 32 above the leading wires has an upper surface which is flush with an upper surface of the active layer 34, as shown in FIG. 5c.

Hereinafter, the method for fabricating an array substrate the present disclosure will be explained with reference to an embodiment in which the data lines are formed in different layers in an alternate manner. The method comprises the following steps.

Figure 6A:
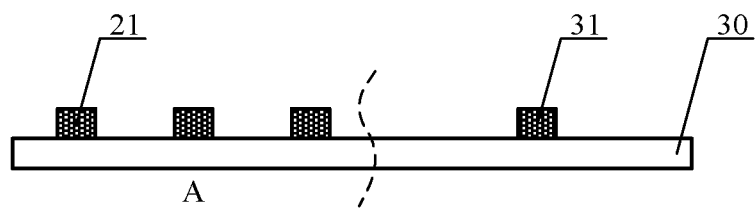
FIG. 6a, FIG. 6b, FIG. 6c, FIG. 6d, FIG. 6e, and FIG. 6f are structural views for illustrating an array substrate at each step of another method for fabricating an array substrate in an embodiment of the present disclosure.

In a first step, the gate 31 of TFT is formed on a substrate, and at the same time, the leading wires 21 are formed in a same layer as the gate, by a patterning process, as shown in FIG. 6a. In FIG. 6a, only some of the leading wires 21 in the fanout area A are shown.

Figure 6B:
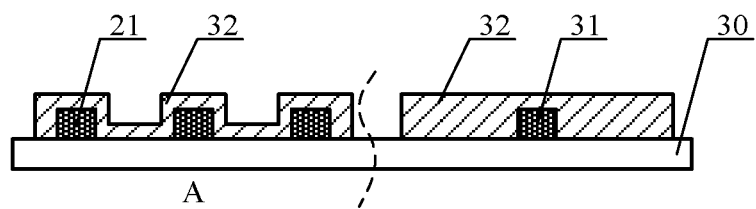

In a second step, the first gate insulating layer 32 is formed above the gate 31 and the leading wires 21 by a patterning process, as shown in FIG. 6b.

Figure 6C:
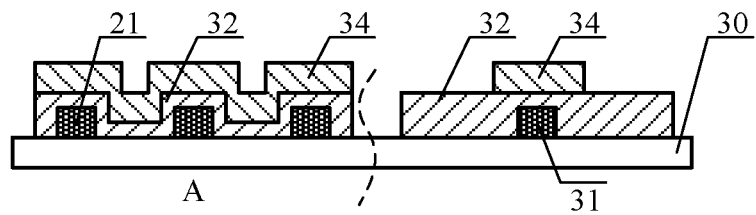

In a third step, the active layer 34 is formed above the first gate insulating layer 32 which is located above the gate 31 and the leading wires 21, by a patterning process, as shown in FIG. 6c.

Figure 6D:
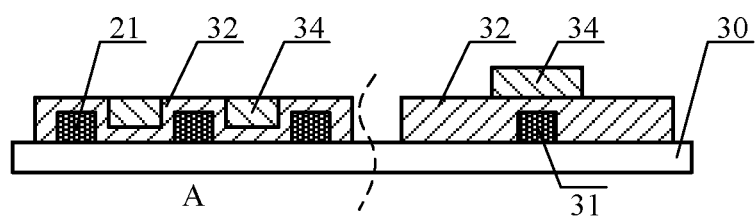

In a fourth step, the active layer 34 in the fanout area A is etched in an etching process, so that the first gate insulating layer above the leading wires is exposed, and the first gate insulating layer above the leading wires has an upper surface which is is flush with the upper surface of the active layer, as shown in FIG. 6d.

Figure 6E:
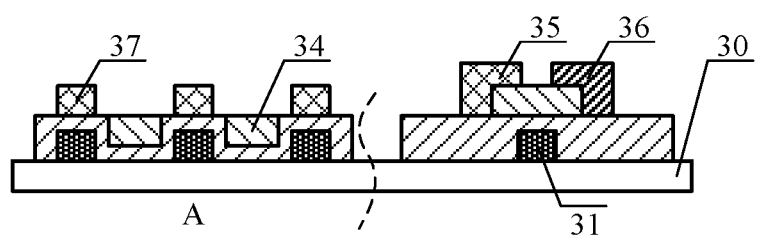
Figure 6F:
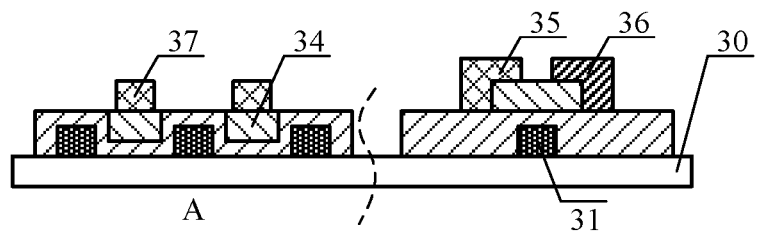

In a fifth step, a pattern of a source 35 and a drain 36 is formed above the active layer of TFT, and at the same time, data lines 37 which are electrically connected with the source are formed above the fanout area active layer, as shown in FIG. 6e. In FIG. 6e, both the data lines 37 and the leading wires 21 are connected with the source, so as to act as data lines which are arranged alternately in two layers. The leading wires are electrically connected with the source through vias in the first gate insulating layer. Furthermore, when the data lines 37 are formed, data lines are formed above the filler, i.e., data lines are formed above the active layer 34 in the fanout area, as shown in FIG. 6f Since the data lines have a width far smaller than that of grooves, the data lines would not block the light irradiation from below the array substrate, even if the data lines are arranged above the grooves.

It is noted that in the above steps, the grooves among leading wires are filled as the same time as steps for fabricating TFT of the array substrate. Of course, the grooves can be filled (i.e., leveled up) after forming the structure of TFT.

The patterning process for forming each pattern in the above steps for example comprises a photolithography process, or comprises a photolithography process and etch steps, and further comprises a process for forming a pre-defined pattern, such printing, ink jetting, or the like. The photolithography process indicates a process which forms a pattern by means of photoresist, mask plate, exposure machine, and comprises processes for film-forming, exposure, development. In practice, the patterning process may be selected according to the structure to be formed in the present disclosure.

On basis of the same inventive concept, an embodiment of the present disclosure further provides a display panel, which comprises the array substrate in any above embodiment. As for embodiments of the display panel, reference can be made to the above embodiments of the array substrate, which are not repeated herein for simplicity.

On basis of the same inventive concept, an embodiment of the present disclosure further provides a display device, which comprises the display panel in the above embodiment. The display device for example is any product or component with a display function like a mobile phone, tablet computer, TV, monitor, notebook computer, digital photo frame, navigator, electronic paper, or the like. As for embodiments of the display device, reference can be made to the above embodiments of the array substrate, which are not repeated herein for simplicity.

Embodiments of the present disclosure provide an array substrate, a method for fabricating the same, a display panel, and a display device. The array substrate comprises: a plurality of leading wires which form a plurality of grooves in a fanout area of the array substrate. The plurality of grooves are filled with a filler, and the filler filled in the grooves has an upper surface which is flush with leading wires surrounding the grooves. The filler is made from an insulating and transparent material. Thus, in embodiments of the present disclosure, since the grooves are filled with the insulating and transparent filler, the upper surface of the filler filled in the grooves is flush with leading wires surrounding the grooves. This alleviates an uneven morphology in the fanout area which results from the leading wires, and avoids the skew defect in the array substrate. The filler has an insulating property, and prevents leading wires from electrical connection with other conductors which otherwise would lead to cross-talk in signal. When the array substrate is subsequently bonded with the color film substrate, a UV glue is applied which is cured by exposure to light. Thus, the transparent filler facilitates curing the UV glue by exposure to light.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. An array substrate, comprising a plurality of leading wires on a base, wherein the plurality of leading wires form a plurality of first grooves in a fanout area of the array substrate, the plurality of first grooves are filled with a filler, and the array substrate further comprises a plurality of TFTs which are electrically connected with each of the leading wires;

wherein the filler has a dual-layer structure which comprises a first layer and a second layer, the first layer is made from an insulating and transparent material and comprises a same material as a gate insulating layer of the TFTs, and the second layer comprises a same material as an active layer of the TFTs, wherein the first layer covers the first grooves and the leading wires and forms a plurality of second grooves over the first grooves, the second layer fills the second grooves, and the second layer has an upper surface which is flush with an upper surface of the first layer above the leading wires, wherein the array substrate further comprises data lines, each of the data lines is electrically connected with a respective source of the TFTs, and is arranged on a side of the first layer away from the base, and each of the leading wires is electrically connected with said respective source through a via in the first layer, and wherein the data lines are spaced apart from the leading wires by the first layer and the second layer and arranged on the upper surface of the second layer in regions right above the first grooves, wherein the first layer comprises silicon nitride, silicon oxide or a combination thereof and the second layer comprises indium gallium zinc oxide, indium tin zinc oxide or amorphous silicon.

2. A display panel, comprising the array substrate of claim 1.

3. A display device, comprising the display panel of claim 2.

\* \* \* \* \*